US010424733B2

(12) United States Patent
Du et al.

(10) Patent No.: US 10,424,733 B2
(45) Date of Patent: Sep. 24, 2019

(54) INTERCONNECT STRUCTURE AND METHOD FOR ON-CHIP INFORMATION TRANSFER

(71) Applicant: NATIONAL UNIVERSITY OF SINGAPORE, Singapore (SG)

(72) Inventors: Wei Du, Singapore (SG); Tao Wang, Singapore (SG); Christian Albertus Nijhuis, Singapore (SG)

(73) Assignee: NATIONAL UNIVERSITY OF SINGAPORE, Singapore (SG)

( * ) Notice: Subject to any disclaimer, the term of this patent is extended or adjusted under 35 U.S.C. 154(b) by 0 days.

(21) Appl. No.: 15/820,627

(22) Filed: Nov. 22, 2017

(65) Prior Publication Data

US 2018/0151802 A1 May 31, 2018

(30) Foreign Application Priority Data

Nov. 25, 2016 (SG) .............. 10201609935Y

(51) Int. Cl.
H01L 49/00 (2006.01)
G02B 6/122 (2006.01)
H01L 23/52 (2006.01)
H01L 23/66 (2006.01)
H01L 49/02 (2006.01)

(52) U.S. Cl.
CPC .......... H01L 49/006 (2013.01); G02B 6/1226 (2013.01); H01L 23/52 (2013.01); H01L 23/66 (2013.01); H01L 28/40 (2013.01); H01L 2223/6627 (2013.01)

(58) Field of Classification Search
CPC .............. H01L 49/006; H01L 23/66; H01L 2223/6627; G02B 6/12; G02B 6/12002; G02B 6/1226; G02B 5/008
See application file for complete search history.

(56) References Cited

U.S. PATENT DOCUMENTS 8,085,459 B1 * 12/2011 Russell .............. G02F 1/03
359/245
8,111,443 B1 * 2/2012 Russell .............. G02F 1/03
359/245
8,379,287 B2 * 2/2013 Suh .................. G02F 1/035
359/240

(Continued)

FOREIGN PATENT DOCUMENTS

KR 101467241 B1 12/2014
KR 1578614 B1 12/2015
WO 2015082343 A1 6/2015

OTHER PUBLICATIONS

A. Emboras, et al. Electrically Controlled Plasmonic Switches and Modulators. IEEE Journal of Selected Topics in Quantum Electronics 12, 4600408 (2015).

(Continued)

Primary Examiner — Scott B Geyer
(74) Attorney, Agent, or Firm — Volpe and Koenig, P.C.

(57) ABSTRACT

An interconnect structure for on-chip information transfer, and a method for on-chip information transfer. The interconnect structure comprises a source configured for electrically generating plasmons; a detector configured for electrically detecting the generated plasmons; and a plasmonic waveguide coupled between the source and the detector.

39 Claims, 3 Drawing Sheets

(56) References Cited

U.S. PATENT DOCUMENTS

| | | | |
|---|---|---|---|
| 8,848,194 B2* | 9/2014 | Walters | G01N 21/55 |
| | | | 356/445 |
| 8,987,754 B1* | 3/2015 | Ribaudo | H01L 49/00 |
| | | | 250/495.1 |
| 9,583,650 B1* | 2/2017 | Yu | H01L 31/0232 |
| 2003/0133339 A1* | 7/2003 | Estes | B82Y 10/00 |
| | | | 365/200 |
| 2003/0179974 A1* | 9/2003 | Estes | B82Y 20/00 |
| | | | 385/2 |
| 2007/0223940 A1 | 9/2007 | Smolyaninov | |
| 2007/0289623 A1* | 12/2007 | Atwater | B82Y 20/00 |
| | | | 136/252 |
| 2008/0212975 A1* | 9/2008 | Burenkov | B82Y 20/00 |
| | | | 398/140 |
| 2010/0097611 A1* | 4/2010 | Song | G01N 21/553 |
| | | | 356/445 |
| 2011/0215705 A1* | 9/2011 | Long | H01J 61/28 |
| | | | 313/231.31 |
| 2012/0006981 A1* | 1/2012 | Van Dorpe | B82Y 20/00 |
| | | | 250/227.11 |
| 2013/0051748 A1* | 2/2013 | Charbon | B82Y 20/00 |
| | | | 385/131 |
| 2015/0333211 A1* | 11/2015 | Ahn | H01L 31/0232 |
| | | | 438/69 |
| 2016/0314867 A1* | 10/2016 | Kabakchiev | B82Y 10/00 |
| 2017/0254952 A1* | 9/2017 | Du | B82Y 15/00 |
| 2017/0285225 A1* | 10/2017 | Du | G02B 5/008 |
| 2017/0302053 A1* | 10/2017 | Sun | H01S 5/0014 |

OTHER PUBLICATIONS

A. Sharma, et al. A carbon nanotube optical rectenna. Nature Nanotechnol. 10, 1027-1032 (2015).
A. Stolz, et al. Nonlinear Photon-Assisted Tunneling Transport in Optical Gap Antennas. Nano Letters. 14, 2330-2338 (2014).
D. K. Gramotnev,et al. Plasmonics beyond the diffraction limit. Nature Photonics. 4 83-91 (2010).
D. M. Koller, et al., Organic plasmon-emitting diode. Nature Photon. 2, 684-687 (2008).
D. R. Ward, et al. Optical rectification and field enhancement in a plasmonic nanogap. Nature Nanotechnol. 5, 732-736 (2010).
D. Shafir, et al. Resolving the time when an electron exits a tunnelling barrier. Nature 485, 343-346 (2012).
E Ozbay. Plasmonics: Merging Photonics and Electronics at Nanoscale Dimensions. Science 311, 189-193 (2006).
F. Bigourdan, et al. Nanoantenna for Electrical Generation of Surface Plasmon Polaritons. Physical Review Letters. 116, 106803 (2016).
G. Schull,et al. Imaging Confined Electrons with Plasmonic Light. Physical Review Letters. 101, 136801 (2008).
G. Walter, et al. 4.3 GHz optical bandwidth light emitting transistor. Applied Physics Letters. 94, 241101 (2009).
H. Ditlbacher, et al. Silver Nanowires as Surface Plasmon Resonators. Physical Review Letters. 95, 257403 (2005).
H. Duan, et al. Nanoplasmonics: Classical down to the Nanometer Scale. Nano Letters. 12, 1683-1689 (2012).
Intel Corporation. Thunderbolt technology. in Tech. Brief (2012).
J. A. Scholl, et al. Observation of Quantum Tunneling between Two Plasmonic Nanoparticles. Nano Lett. 13, 564-569 (2013).
J. Aizpurua, et al. Role of tip shape in light emission from the scanning tunneling microscope. Physical Review B. 62, 2065-2073 (2000).
J. B. Khurgin. How to deal with the loss in plasmonics and metamaterials. Nature Nanotechnology 10, 2-6 (2015).
J. C. Weeber, et al. Optical near-field distributions of surface plasmon waveguide modes. Phys. Rev. B 68, 115401 (2003).
J. Kern, et al. Electrically driven optical antennas. Nature Photonics. 9, 582-586 (2015).
J. Lambe, et al. Light Emission from Inelastic Electronic Tunnelling. Phys. Rev. Lett. 37, 923 (1976).
J. Nelayah. Mapping surface plasmons on a single metallic nanoparticle. Nature Physics 3, 348-353 (2007).
J.A. Conway, et al. Plasmonic interconnects versus conventional interconnects: a comparison of latency, cross-talk and energy costs. Express 15, 4474-4484 (2007).
K. A. Willets, et al. Localized Surface Plasmon Resonance Spectroscopy and Sensing. Rev. Phys. Chem. 58, 267-297 (2007).
K. C. Y. Huang, et al. Electrically driven subwavelength optical nanocircuits. Nature Photon. 8, 244-249 (2014).
L. C. Davis. Theory of surface-plasmon excitation in metal-insulator-metal tunnel junctions. Physical Review. B 16, 2482 (1976).
M. Bosman, et al. Mapping surface plasmons at the nanometre scale with an electron beam. Nanotechnology 18, 165505 (2007).
M. L. Brongersma, et al. The Case for Plasmonics. Science 328, 440-441 (2010).
M. Parzefall, et al. Antenna-coupled photon emission from hexagonal boron nitride tunnel junctions. Nature Nanotechnol. 10, 1058-1063 (2015).
M. Schnell, et al. Nanofocusing of mid-infrared energy with tapered transmission lines. Nature Photonics 5, 283-287 (2011).
N. Kinsey, et al. Examining nanophotonics for intergrated hybrid systems: a review of plasmonic interconnects and modulators using traditional and alternative methods. J. Opt. Soc. Am. B 32, 121 (2015).
W. Du, Highly efficient on-chip direct electronic-plasmonic transducers. Nature Photonics 11, 623-627 (2017).
P. Berini. Long-range surface plasmon polaritons. Adv. Opt. Photon. 1, 484-588 (2009).
P. Berini. Figures of merit for surface plasmon waveguides. Opt. Express 14, 13030-13042 (2006).
P. Bharadwaj, et al. Electrical Excitation of Surface Plasmons. Physical Review Letters. 106, 226802 (2011).
P. Fan, et al. An Electrically-Driven GaAs Nanowire Surface Plasmon Source. Nano Letters. 12, 4943-4947 (2012).
P. Neutens, et al. Electrical Excitation of Confined Surface Plasmon Polaritons in Metallic Slot Waveguides. Nano Letters. 10, 1429-1432 (2010).
P. Rai, et al. Electrical Excitation of Surface Plasmons by an Individual Carbon Nanotube Transistor. Physical Review Letters. 111, 026804 (2013).
R. Arielly, et al. Accurate Determination of Plasmonic Fields in Molecular Junctions by Current Rectification at Optical Frequencies. Nano Letters. 11, 2968-2972 (2011).
R. Berndt, et al. Inelastic Tunneling Excitation of Tip-Induced Plasmon Modes on Noble-Metal Surfaces. Physical Review Letters. 67, 3796-3799 (1991).
R. F. Oulton, et al. A Hybrid plasmonic waveguide for subwavelength confinement and long-range propagation. Nature Photon. 2, 496-500 (2008).
R. J. Walters, et al. A silicon-based electrical source of surface plasmon polaritons. Nature Materials. 9, 21-25 (2009).
S. A. Maier, et al. Plasmonics: Localization and guiding of electromagnetic energy in metal/dielectric structures. Journal of Applied Physics. 98, 011101 (2005).
S. Assefa, et al. A 90nm CMOS Integrated Nano-Photonics Technology for 25 Gbps WDM Optical Communications Applications. IEEE International Electron Devices Meeting (2012).
S. I. Bozhevolnyi, et al. Channel plasmon subwavelength waveguide components including interferometers and ring resonators. Nature 440, 508-511 (2006).
S. Lal, et al. Nano-optics from sensing to waveguiding. Nature Photon. 1, 641-64 (2007).
T. Wang, et al. Scattering of electrically excited surface plasmon polaritons by gold nanoparticles studied by optical Interferometry with a scanning tunneling microscope. Phys. Rev. B 92, 045438 (2015).
Technology Quarterly—After Moore's law, The Economist, Issue Mar. 12-18, 2016.
W. Du, et al. On-chip molecular electronic plasmon sources based on self-assembled monolayer tunnel junctions. Nature Photonics. 10, 274-280 (2016).
W. L. Barnes, et al. Surface plasmon subwavelength optics. Nature 424, 824-830 (2003).

(56) References Cited

OTHER PUBLICATIONS

Y. Arakawa, et al. Silicon Photonics for Next Generation System Integration Platform. IEEE Communications Magazine, Mar. 2013.

* cited by examiner

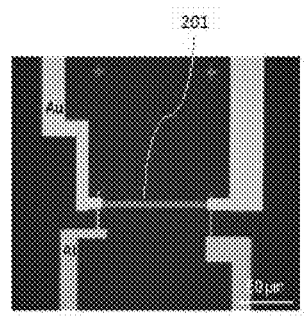
Fig. 2A
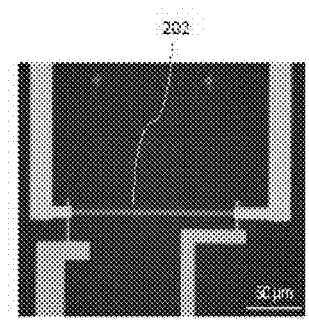
Fig. 2B
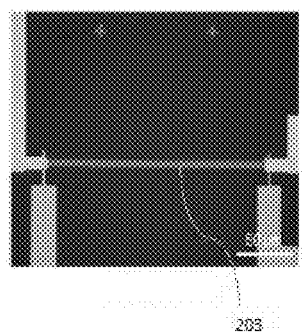
Fig. 2C
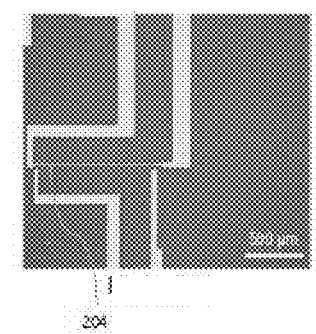
Fig. 2D
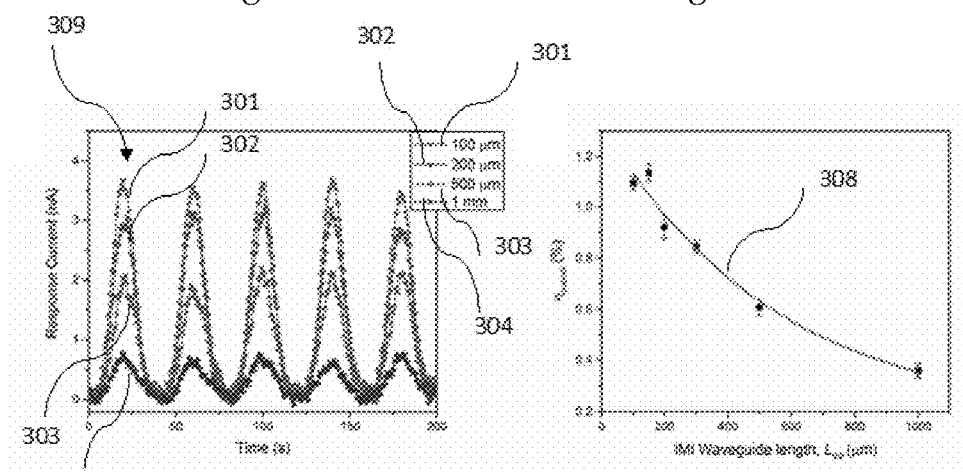
Fig. 3A
Fig. 3B

INTERCONNECT STRUCTURE AND METHOD FOR ON-CHIP INFORMATION TRANSFER

CROSS-REFERENCE TO RELATED APPLICATION

This application claims the benefit of priority of Singapore Patent Application No. 10201609935Y filed on Nov. 25, 2016, the content of which is incorporated herein by reference in its entirety for all purposes.

TECHNICAL FIELD

This invention relates broadly to an interconnect structure and method for on-chip information transfer.

BACKGROUND

For the last decades, the tremendous growth in information processing and computation speed was possible by doubling the density of transistors every 1-2 years (following the so-called Moore's Law) resulting in efficient electronic circuits inside our smart TVs, phones and laptops. Since the last decade clock speeds have been capped to prevent processors from overheating and in the past two years the fabrication cost involved with making the very small transistors resulted in an increase in the price tag of transistors: new technologies are required to meet consumers demand to deliver the speed and functionality we come to expect with each generation of (affordable) smart phones, personal computers, and other devices.

One way to increase computing power is to develop new types of low-latency interconnect architectures that enhance upcoming on-chip system architectures, e.g., 3-D IC package, or stacked High-Bandwidth Memories (HBM). Unlike electrons, photons do not create capacitive effects or generate stray electric fields that hamper transmission speeds. Photons are generated, guided, and detected, using optical elements which can have extremely large bandwidths of hundreds of GHz. Unfortunately, photonic interconnects are far too large in size (few $cm^2$) to be integrated with CMOS. There is a critical need for high bandwidth intermediate and global interconnects (similar to photonic elements) with small foot prints (similar to that of CMOS).

Photons generally do not interact with one another and thus do not create capacitive effects to slow down transmission speeds or generate stray electric field which introduces cross-talk between the dense networks of metal lines. Although optical elements, such as dispersion shifted optical fibers, have tremendously large bandwidths of hundreds of GHz, photonic interconnects are far too large in size (typically several $cm^2$) and cannot be readily integrated with CMOS [5]. To overcome this size mismatch, plasmonics is a way forward to reduce the critical dimension of optical components, in principle, far below the optical wavelength compatible with sub-micron Si electronic devices [6, 7]. Here, the information carriers are so-called surface plasmon polaritons (SPPs)—collective surface charge oscillations at the metal-dielectric interface which can be confined to nano-scale structures of 10-100 nm [8]. Plasmonics are promising provided that plasmons can be electrically excited, manipulated, and detected, and transmit information with low losses.

There are two major reasons that hamper the use of plasmonics in integrated circuitry: 1) Efficient methods for plasmon detection and generation are lacking and 2) plasmonics suffers from a trade-off between plasmon-confinement and propagation length. Plasmons are usually excited by bulky light sources (e.g., lasers) [9], inside scanning tunneling microscopes [10-14], or transmission electron microscopes [15-18]. But to exploit the advantages of plasmons in nano-scale electronic circuitry, it is desired to generate, detect, and manipulate, plasmons on-chip by electrical means. Most strategies to develop on-chip electrically driven plasmon sources involve miniaturization of light sources [19, 20], e.g., nano light emitting diodes (LEDs) [21-23], or carbon nanotubes [24], but these approaches rely on slow electron-hole recombination processes resulting in a photon which then excites a plasmon [25]. In contrast, tunneling currents that flow across metal-insulator-metal (MIM) junctions can directly excite plasmons without the need for electron-hole generation [26-29]. Here, tunneling electrons can couple to plasmons within quantum mechanical time-scales [30]. The reverse process when plasmons couple to tunneling currents, the so-called plasmon-assisted tunneling or optical rectification, is also possible and can be used for plasmon detection [31-34]. So far, it is not clear how efficient plasmon excitation or detection via tunneling electrons is. Previous experiments have focused on light excitation via tunneling electrons and suggested it is a low yield process and only an estimated 1 in $10^4$-$10^6$ electrons would couple to a photon [26-28] despite that some theories have suggested that 10% efficiencies should be possible [35, 36]. These experiments always measured the number of photons emitted from the junctions (i.e., radiative decay of the plasmons) but likely most plasmons dissipate thermally without emitting a photon resulting in large underestimates of the plasmon excitation efficiency.

Plasmons have unique features and benefits that are appealing for optical signal processing, sensing and imaging [37-39]. However, translation to practical applications of plasmonic materials is hindered by dissipative loss [40]. To overcome this challenge, it is important to develop new techniques for reliable fabrication of optimally designed structures and to advance theoretical understanding to minimize loss. The propagation length and plasmon confinement depends not only on the properties of the plasmonic materials or of the supporting medium, but also on the geometry, the frequency of operation, and the field symmetry of the plasmon mode [41]. More specifically, a large number of structures have been investigated for plasmonic waveguiding, e.g., metallic nanowires or nanostrips [42, 43], thin dielectrics sandwiched between two metals [44], nano-grooves in metal substrates [45], and hybrid plasmonic waveguides of dielectric nanowires placed in close proximity (few nm) to a metal surface [46]. The issue is that the more a SPP mode is confined, the quicker it dissipates. So-called long-range SPPs (LRSPPs) propagate along thin metal strips embedded in a dielectric medium for up to centimeters [47], but these modes are not well confined and can only be used in applications where the interconnects are widely spaced (5 to 10 times the wavelength, or >5-10 µm). Metal-insulator-metal waveguides support highly confined plasmon modes (<$\frac{1}{10}$ times the corresponding wavelength in vacuum, $\lambda_{vac}$) which dissipate quickly and can only propagate on the order of tens of micrometers [48, 49].

Embodiments of the present invention seek to address one or more of the above-mentioned needs.

SUMMARY

In accordance with a first aspect of the present invention there is provided an interconnect structure for on-chip information transfer, comprising a source configured for electrically generating plasmons; a detector configured for electrically detecting the generated plasmons; and a plasmonic waveguide coupled between the source and the detector.

In accordance with a second aspect of the present invention there is provided a method for on-chip information transfer, the method comprising the steps of electrically generating plasmons; electrically detecting the generated plasmons; and propagating the plasmons in a plasmonic waveguide coupled between the source and the detector.

BRIEF DESCRIPTION OF THE DRAWINGS

The invention will be better understood with reference to the detailed description when considered in conjunction with the non-limiting examples and the accompanying drawings, in which:

FIG. 2 (a) shows an optical image of an interconnect structure according to an example embodiment with a plasmonic waveguide of 100 μm length.

FIG. 2 (b) shows an optical image of an interconnect structure according to an example embodiment with a plasmonic waveguide of 150 μm length.

FIG. 2 (c) shows an optical image of an interconnect structure according to an example embodiment with a plasmonic waveguide of 200 μm length.

FIG. 2 (d) shows an optical image of an interconnect structure according to an example embodiment with a plasmonic waveguide of 1 mm length.

FIG. 3 (a) shows a graph illustrating current responses in the detectors of the interconnect structures of FIGS. 2 (a)-(d), respectively.

FIG. 3 (b) shows a graph illustrating overall efficiency of the interconnect structures of FIGS. 2 (a)-(d).

DETAILED DESCRIPTION

As mentioned in the background section, photonic elements can carry information with large bandwidths at very high speeds, but these elements are too large to be compatible with modern day nano-electronics and not compatible with on-chip applications. However, light can be captured and manipulated in the form of plasmons which are compatible in size with chip-scale nanoelectronics.

According to example embodiments, to be able to use plasmons as on-chip or chip-to-chip information carriers, the plasmons are excited, manipulated, and detected by electrical means (i.e. not by lasers or other light sources as has been done in existing reports), with technologically relevant efficiencies. The plasmon sources and detectors are preferably able to be on-chip integrated with a compact size and low energy consumption. Plasmons are, however, lossy and signals degrade quickly often just over a few micrometers. For intermediate and global interconnects which cover few tens of micrometers to cm length scales, embodiments of the present invention are preferably configured to excite long range plasmon modes. Accordingly, example embodiments can meet industry needs, achieved by electrical means (i.e. not by lasers or other light sources) while having small footprints of the devices (tens of μm$^2$). Example embodiments of the present invention can make it possible to replace slow copper based interconnects by extremely high bandwidth plasmonic interconnects.

Generally, example embodiments of the present invention provide electrically-driven plasmonic circuits based on LRSPPs. By coupling two MIM tunnel junctions with an index-matched insulator-metal-insulator (IMI) plasmonic waveguide, SPPs are electrically excited by the MIM junction with a micrometer scale coupled to the LRSPP mode along the IMI waveguide, and electrically detected by the other MIM junction up to 1 mm away from the plasmon source, according to example embodiments. The contact pads of these MIM junctions have the possibility to be integrated with the pins of the microelectronic chips, and the IMI waveguide can also be easily combined with the fan-out or I/O connections, providing example embodiments of the present invention great opportunity in the next generation integrated opto-electronic circuits for on-chip information processing and chip-to-chip communications.

Figure 1A:
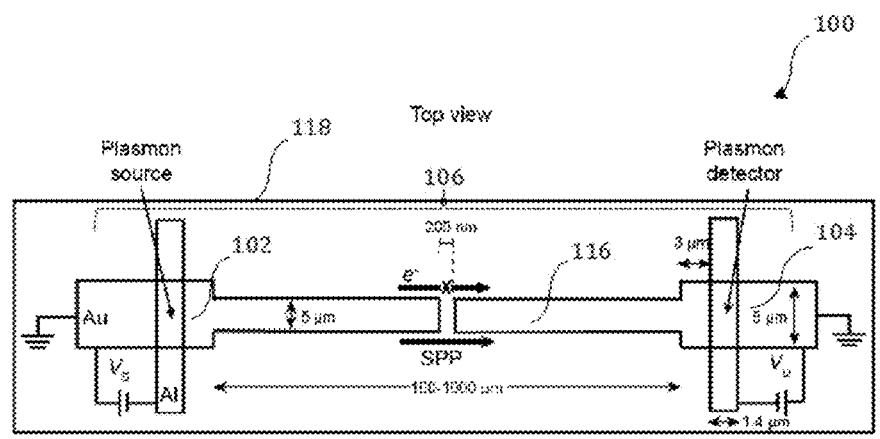
FIG. 1(a) shows a schematic top view of an interconnect structure according to an example embodiment.
Figure 1B:
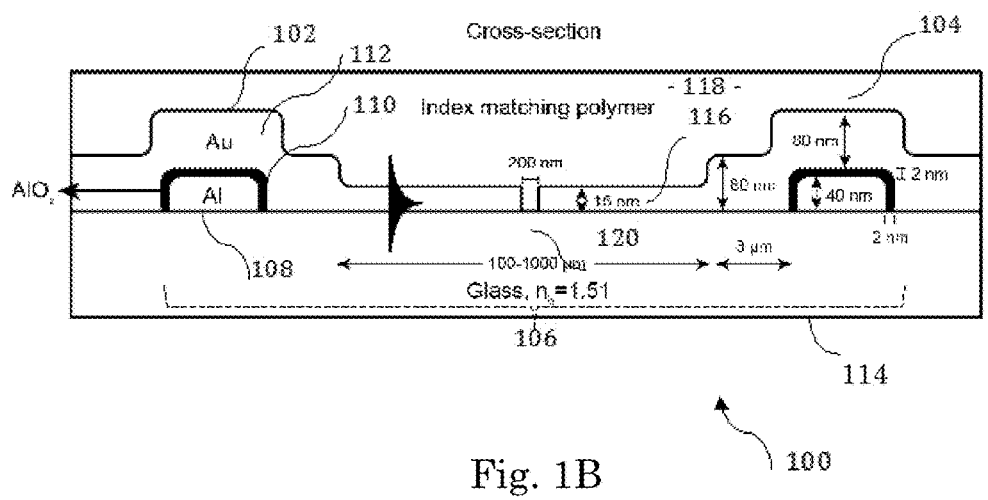
FIG. 1 (b) shows a schematic cross-sectional view of the interconnect structure of FIG. 1 (a).

FIGS. 1 (a) and (b) shows the device 100 according to an example embodiments schematically in which two MIM junctions 102, 104 are connected with an IMI plasmonic waveguide 106. Each MIM junction 102, 104 consists of a 40 nm thick Al wire 108 with its native oxide AlO$_x$ layer 110 of ~2 nm as the tunneling barrier, and an 80 nm thick Au wire 112. The IMI plasmonic waveguide 106 is a 15 nm thin gold stripe 116 on the glass substrate 114 with a width of 5 μm and covered by a Poly(methyl methacrylate) (PMMA) index matching polymer 118. During the experiments, one MIM junction, here the junction 102 on the left side in FIGS. 1 (a) and (b) works as the SPP source and the other one junction 104 on the right side in FIGS. 1 (a) and (b) works as the SPP detector. The IMI waveguide 106 has a 200 nm gap 120 to electrically isolate the two MIM junctions 102, 104 but to ensure SPP propagation. By applying a bias $V_S$ across the source junction 102, a current $I_S$ flows as a result of quantum mechanical tunneling. Some of the electrons may tunnel inelastically and lose energy to excite localized surface plasmons [26-28] in the tunnel junction and propagating SPPs along the Au electrodes 108 as the initial waveguide. The SPPs then couple to the IMI waveguide 106 as the LRSPP mode, reach the detector junction 104, and modulate the tunneling current of the detector junction $I_D$ at an applied detector bias $V_D$ through plasmon-assisted tunneling [31-34] to yield a current increase in the form of response current $\Delta I_D$.

With reference to FIG. 1 (b), in this example embodiment plasmonic-electronic transducers (in the form of Al/AlO$_x$/Au MIM tunnel junctions 102) coupled with an IMI waveguide 106 (in the form of PMMA/Au/glass sandwich) for LRSPPs is provided. The indices of the glass substrate 114 and the PMMA index matching polymer 118 at the wavelength of 1000 nm are about 1.51 and 1.49 respectively.

Devices containing IMI waveguides with different lengths while keeping the MIM junctions unchanged were fabricated in different embodiments. FIGS. 2 (a) to (d) show the optical images of the devices according to example embodiments with the length of IMI waveguides $L_{IMI}$ ranging from 100 μm to 1 mm, specifically (a) 100 μm IMI waveguide 201, (b) 150 μm IMI waveguide 202, (c) 200 μm IMI waveguide 203, and (d) 1 mm IMI waveguide 204. During the experiments, the same source bias $V_S$ and the same detector bias $V_D$ were used for the different devices and the $\Delta I_D$ of the detector junction was measured as a function of $L_{IMI}$.

FIG. 3 (a) shows the time traces (curves 301 to 304) of the $\Delta I_D$ of the detector junction as a function of $L_{IMI}$ according to the example embodiments of FIG. 2. The $\Delta I_D$ clearly demonstrates the on-chip information transfer through current modulation between two MIM junctions with a separation up to 1 mm and indicates the performance of the on-chip electrically-driven plasmonic circuits according to example embodiments. The on-chip information transfer across such distances should largely depend on the large propagation length of the LRSPP mode of the IMI waveguide. The $V_S$ is a sinusoidal function from 0 to −1.4 V and $V_D$=−0.5 V is applied at the source during the measurements, with the peaks e.g. 309 in the curve 301 demonstrating detection of the plasmons at the detector, i.e. the modulated $I_D$.

With reference to FIG. 3 (b), to identify the propagation length of the LRSPP mode according to example embodiments, the overall efficiency $\eta_{overall}$ ($=\Delta I_D/I_S$) was calculated as a function of $L_{IMI}$. The $\eta_{overall}$ decreases from about 1.1% to about 0.35% when $L_{IMI}$ increases from 100 μm to 1 mm. This $\eta_{overall}$ includes the efficiency of plasmon excitation at the source junction, the propagation loss of the SPPs and LRSPPs, and the efficiency of plasmon detection of the detector junction and is about 2-5 orders higher than previous reported electron-to-photon efficiency in MIM tunnel junctions [26-28]. By an exponential fitting (curve 308), the decay length of the LRSPP mode along the IMI waveguide is ~550 μm. Such a propagation length fits well with the theoretical calculated values for the LRSPP mode along such an IMI waveguide according to example embodiments.

The example embodiments described above demonstrate on-chip electrically-driven plasmonic circuits based on LRSPPs which enables the information transfer between two MIM junctions with a separation distance up to 1 mm. This on-chip electrically-driven plasmonic circuit according to example embodiments integrates the following main processes, electrical excitation of SPPs, coupling from SPPs to LRSPPs and the LRSPP propagation along the IMI waveguide, and electrical detection of SPPs, all on a single chip. This on-chip LRSPP-based electrically-driven information transfer according to example embodiments overcomes the difficulties in photonic circuits such as: the complicated fabrication process of the on-chip photon sources and detectors, the limited coupling efficiency between photonic waveguides and on-chip photon sources or detectors. This on-chip electrically-driven LRSPP-based plasmonic circuit according to example embodiments has the possibility to work in a frequency higher than GHz, preferably in the THz range, because of the fast modulation frequency defined by the timescale of electron tunneling in the MIM junctions. This on-chip electrically-driven LRSPP-based plasmonic circuit according to example embodiments also has the potential to easily integrate with the microelectronic chips through their pins and I/O connectors with a low power consumption, which may largely improve the efficiency of the data processing and transportation.

Unlike in previously proposed devices, in which the LRSPPs have been only excited by optical means (lasers and other light sources) and which therefore are not CMOS compatible, example embodiments of the present invention provide on-chip electrically-driven LRSPP interconnects with micrometer scale footprints (as opposed to footprints of $cm^2$), which constitutes an improvement of a factor of 1 000 000. Devices according to the example embodiments described herein include the plasmon source, the plasmonic waveguide up to 1 mm, and the plasmon detector, all with a microscale footprint. The devices according to the example embodiments described herein are made with standard fabrication processes, high throughput, which are CMOS compatible.

Specifically, in the example embodiments the devices were fabricated using the following example processes and conditions, by way of example, not limitation:

The 15 nm thin gold stripe 116 was fabricated using a standard electron beam lithography technique followed by a thermal evaporation of gold. The fabrication process of the MIM junctions 102 and 104, shown in FIG. 1, was performed as described in US20170254952 A1, the content of which is incorporated herein by reference in its entirety for all purposes, and in Nature Photonics 11, 623-627 (2017), the content of which is incorporated herein by reference in its entirety for all purposes. The index matching layer 118 is drop casted on the MIM junctions to form the IMI plasmonic waveguide 106, and thus the example embodiments 100.

It is noted that in different embodiments, other material systems may be used. For example, the two electrodes of the MIM junctions can be any metal that supports SPP, such as gold, silver, aluminum, copper etc. The tunnel barrier of the MIM junctions can be any dielectric material such as $AlO_x$ ($Al_2O_3$), $SiO_2$ etc.

Advantageously, the devices according to the example embodiments described above do not require operation involving lasers or other light sources.

Embodiments of the present invention can have one or more of the following features and advantages.

| Feature | Benefit/Advantage |
| --- | --- |
| Working at quantum mechanical tunneling time scale | $10^6$ faster than conventional semiconductor devices |
| Standard photolithography process | Scalability, high throughput, the easy integration with the microelectronic chip |
| Working at low voltage and low current | Low power consumption, compatible with microelectronic chips |
| Direct on-chip integration between the plasmon source, plasmon detector and the waveguide | Compact size, easy fabrication |

In one embodiment, an interconnect structure for on-chip information transfer is provided, comprising a source configured for electrically generating plasmons; a detector configured for electrically detecting the generated plasmons; and a plasmonic waveguide coupled between the source and the detector.

The source may comprise a metal-insulator-metal (MIM) junction. The MIM junction may be configured for generating the plasmons via bias induced tunneling.

The detector may comprise a metal-insulator-metal (MIM) junction. The MIM junction may be configured for detecting the generated plasmons via a modified tunnel-current under bias induced tunneling.

The plasmonic waveguide may comprise a first portion configured for propagating surface plasmon polaritons (SPPs) excited in the source. The plasmonic waveguide may comprise a second portion configured for coupling the SPP to a long range SPP (LRSPP) mode of the second portion and propagation of LRSPPs. The plasmonic waveguide may comprise two sections separated by a gap configured for electrical isolation of the source and detector while preserving the propagation of the LRSPPs. The plasmonic waveguide may have a smaller thickness than the first portion. The plasmonic waveguide may comprise a third portion configured for coupling the LRSPPs to an SPP mode of the third portion for detection of the SPPs in the detector. The third portion of the plasmonic waveguide may have a larger thickness than the second portion.

The plasmonic waveguide may comprise a insulator-metal-insulator (IMI) plasmonic waveguide.

The plasmonic waveguide may have a length of up to about 1 mm.

The plasmonic waveguide may have a length in the range from about 100 μm to 1 mm.

The source, the detector and the plasmonic waveguide may be formed on the same substrate.

Figure 4:
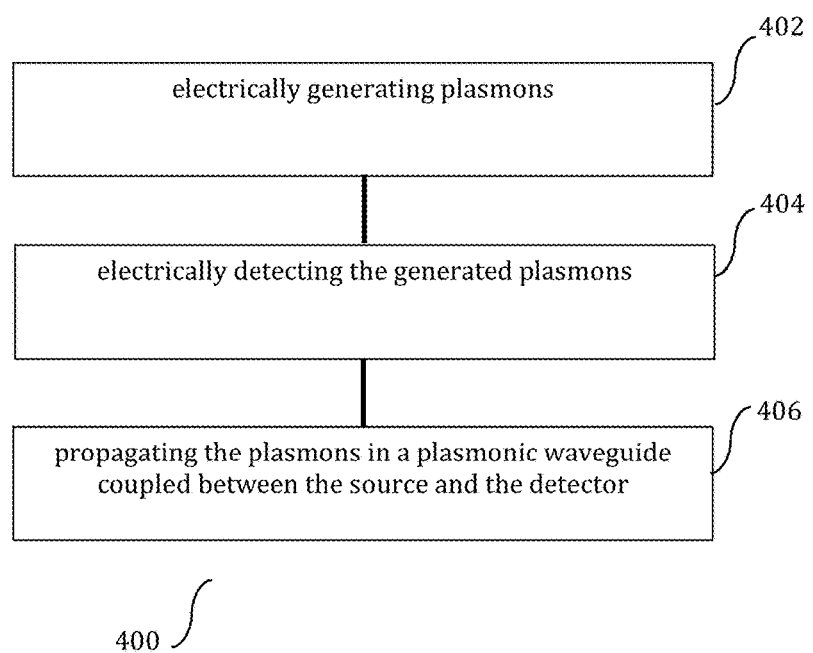
FIG. 4 shows a flow chart illustrating a method for on-chip information transfer, according to an example embodiment.

FIG. 4 shows a flow chart 400 illustrating a method for on-chip information transfer, according to an example embodiment. At step 402, plasmons are electrically generated. At step 404, the generated plasmons are electrically detected. At step 406, the plasmons are propagated in a plasmonic waveguide coupled between the source and the detector.

The method may comprise generating the plasmons via bias induced tunneling.

The method may comprise detecting the generated plasmons via a modified tunnel-current under bias induced tunneling.

The method may comprise propagating surface plasmon polaritons (SPPs) excited in the source in a first portion of plasmonic waveguide. The method may comprise coupling the SPP to a long range SPP (LRSPP) mode of a second portion of the plasmonic waveguide and propagating the LRSPPs. The method may comprise providing a gap in the second portion of the plasmonic waveguide for electrical isolation of the source and detector while preserving the propagation of the LRSPPs. The method may comprise coupling the LRSPPs to an SPP mode of a third portion of the plasmonic waveguide for detection of the SPPs in the detector.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive. Also, the invention includes any combination of features, in particular any combination of features in the patent claims, even if the feature or combination of features is not explicitly specified in the patent claims or the present embodiments.

The various functions or processes disclosed herein may be described as data and/or instructions embodied in various computer-readable media, in terms of their behavioral, register transfer, logic component, transistor, layout geometries, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the internet and/or other computer networks via one or more data transfer protocols (e.g., HTTP, FTP, SMTP, etc.). When received within a computer system via one or more computer-readable media, such data and/or instruction-based expressions of components and/or processes under the system described may be processed by a processing entity (e.g., one or more processors) within the computer system in conjunction with execution of one or more other computer programs.

Aspects of the systems and methods described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the system include: microcontrollers with memory (such as electronically erasable programmable read only memory (EEPROM)), embedded microprocessors, firmware, software, etc. Furthermore, aspects of the system may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the systems and methods is not intended to be exhaustive or to limit the systems and methods to the precise forms disclosed. While specific embodiments of, and examples for, the systems components and methods are described herein for illustrative purposes, various equivalent modifications are possible within the scope of the systems, components and methods, as those skilled in the relevant art will recognize. The teachings of the systems and methods provided herein can be applied to other processing systems and methods, not only for the systems and methods described above.

The elements and acts of the various embodiments described above can be combined to provide further embodiments. These and other changes can be made to the systems and methods in light of the above detailed description.

In general, in the following claims, the terms used should not be construed to limit the systems and methods to the specific embodiments disclosed in the specification and the claims, but should be construed to include all processing systems that operate under the claims. Accordingly, the systems and methods are not limited by the disclosure, but instead the scope of the systems and methods is to be determined entirely by the claims.

REFERENCES

Intel Corporation. "Thunderbolt technology" in Tech. Brief (2012).

S. Assefa et al. IEEE International Electron Devices Meeting (2012).
Technology Quarterly—After Moore's law, The Economist, issue Mar. 12-18 (2016).
Y. Arakawa, T. Nakamura. IEEE Communications Magazine, March (2013).
A. Emboras et al. IEEE Journal of Selected Topics in Quantum Electronics 12, 4600408 (2015).
E. Ozbay. Science 311, 189-193 (2006).
M. L. Brongersma, V. M. Shalaev. Science 328, 440-441 (2010).
W. L. Barnes, A. Dereux, T. W. Ebbesen, Nature 424, 824-830 (2003).
S. A. Maier, H. A. Atwater. J. Appl. Phys. 98, 011101 (2005).
R. Berndt, J. K. Gimzewski, P. Johansson, Phys. Rev. Lett. 67, 3796-3799 (1991).
J. Aizpurua, S. P. Apell, R. Berndt. Phys. Rev. B 62, 2065-2073 (2000).
G. Schull, M. Becker, R. Berndt. Phys. Rev. Lett. 101, 136801 (2008).
P. Bharadwaj, A. Bouhelier, L. Novotny, Phys. Rev. Lett. 106, 226802 (2011).
T. Wang et al. Phys. Rev. B 92, 045438 (2015).
J. NELAYAH et al. Nature Physics 3, 348-353 (2007).
M. Bosman et al. Nanotechnology 18, 165505 (2007).
H. Duan et al. Nano Lett. 12, 1683-1689 (2012).
J. A. Scholl, A. Garcia-Etxarri, A. L. Koh, J. A. Dionne. Nano Lett. 13, 564-569 (2013).
D. M. Koller et al., Nature Photon. 2, 684-687 (2008).
K. C. Y. Huang et al. Nature Photon. 8, 244-249 (2014).
R. J. Walters et al. Nature Mater. 9, 21-25 (2009).
P. Neutens, L. Lagae, G. Borghs, P. V. Dorpe. Nano Lett. 10, 1429-1432 (2010).
P. Fan et al. Nano Lett. 12, 4943-4947 (2012).
P. Rai et al. Phys. Rev. Lett. 111, 026804 (2013).
G. Walter, C. H. Wu, H. W. Then, M. Feng, N. Holonyak Jr. Appl. Phys. Lett. 94, 241101 (2009).
J. Lambe, S. L. McCarthy. Phys. Rev. Lett. 37, 923 (1976).
J. Kern et al. Nature Photon. 9, 582-586 (2015).
M. Parzefall et al. Nature Nanotechnol. 10, 1058-1063 (2015).
W. Du et al. Nature Photon. 10, 274-280 (2016).
D. Shafir et al. Nature 485, 343-346 (2012).
D. R. Ward et al. Nature Nanotechnol. 5, 732-736 (2010).
R. Arielly, A. Ofarim, G. Noy, Y. Selzer. Nano Lett. 11, 2968-2972 (2011).
A. Stolz et al. Nano Lett. 14, 2330-2338 (2014).
A. Sharma, V. Singh, T. L. Bougher, B. A. Cola. Nature Nanotechnol. 10, 1027-1032 (2015).
L. C. Davis. Phys. Rev. B 16, 2482 (1976).
F. Bigourdan et al., Phys. Rev. Lett. 116, 106803 (2016).
K. A. Willets, R. P. Van Duyne. Ann. Rev. Phys. Chem. 58, 267-297 (2007).
S. Lal, S. Link, N. J. Halas, Nature Photon. 1, 641-64 (2007).
D. K. Gramotnev, S. I. Bozhevolnyi. Nature Photon. 4 83-91 (2010).
J. B. Khurgin. Nature Nanotechnology 10, 2-6 (2015).
N. Kinsey, M. Ferrera, V. M. Shalaev, A. Boltasseva. J. Opt. Soc. Am. B 32, 121 (2015).
J. C. Weeber, Y. Lacroute, A. Dereux. Phys. Rev. B 68, 115401 (2003).
H. Ditlbacher et al. Phys. Rev. Lett. 95, 257403 (2005).
M. Schnell et al. Nature Photonics 5, 283-287 (2011).
S. I. Bozhevolnyi et al. Nature 440, 508-511 (2006).
R. F. Oulton et al. Nature Photon. 2, 496-500 (2008).
P. Berini. Adv. Opt. Photon. 1, 484-588 (2009).
P. Berini. Opt. Express 14, 13030-13042 (2006).
J. A. Conway, S. Sahni, T. Szkopek. Opt. Express 15, 4474-4484 (2007).

What is claimed is:

1. An interconnect structure for on-chip information transfer, comprising:
a source configured for electrically generating plasmons;
a detector configured for electrically detecting the generated plasmons; and
a plasmonic waveguide coupled between the source and the detector;
wherein the source or the detector comprise a metal-insulator-metal (MIM) junction for electrically generating the plasmons or for electrically detecting the generated plasmons, respectively.

2. The interconnect structure of claim 1, wherein the MIM junction is configured for generating the plasmons via bias induced tunneling.

3. The interconnect structure of claim 1, wherein the MIM junction is configured for detecting the generated plasmons via a modified tunnel-current under bias induced tunneling.

4. The interconnect structure of claim 1, wherein the plasmonic waveguide comprises a first portion configured for propagating surface plasmon polaritons (SPPs) excited in the source.

5. The interconnect structure of claim 4, wherein the plasmonic waveguide comprises a second portion configured for coupling the SPPs to a long range SPP (LRSPP) mode of the second portion and propagation of LRSPPs.

6. The interconnect structure of claim 5, wherein the second portion of the plasmonic waveguide comprises two sections separated by a gap configured for electrical isolation of the source and detector while preserving the propagation of the LRSPPs.

7. The interconnect structure of claim 6, wherein the second portion of the plasmonic waveguide has a smaller thickness than the first portion.

8. The interconnect structure of claim 6, wherein the plasmonic waveguide comprises a third portion configured for coupling the LRSPPs to an SPP mode of the third portion for detection of the SPPs in the detector.

9. The interconnect structure of claim 8, wherein the third portion of the plasmonic waveguide has a larger thickness than the second portion.

10. The interconnect structure of claim 1, wherein the plasmonic waveguide comprises a insulator-metal-insulator (IMI) plasmonic waveguide.

11. The interconnect structure of claim 1, wherein the plasmonic waveguide has a length of up to about 1 mm, preferably in the range from about 100 µm to 1 mm.

12. The interconnect structure of claim 1, wherein the source, the detector and the plasmonic waveguide are formed on the same substrate.

13. A method for on-chip information transfer, the method comprising the steps of:
providing the interconnect structure of claim 1;
electrically generating plasmons using the interconnect structure;
electrically detecting the generated plasmons using the interconnect structure; and
propagating the plasmons in the plasmonic waveguide coupled between the source and the detector using the interconnect structure.

14. The method of claim 13, comprising generating the plasmons via bias induced tunneling.

15. The method of claim 13, comprising detecting the generated plasmons via a modified tunnel-current under bias induced tunneling.

16. The method of claim 13, comprising propagating surface plasmon polaritons (SPPs) excited in the source in a first portion of plasmonic waveguide.

17. The method of claim 11, comprising coupling the SPPs to a long range SPP (LRSPP) mode of a second portion of the plasmonic waveguide and propagating the LRSPPs.

18. The method of claim 12, comprising providing a gap in the second portion of the plasmonic waveguide for electrical isolation of the source and detector while preserving the propagation of the LRSPPs, preferably comprising coupling the LRSPPs to an SPP mode of a third portion of the plasmonic waveguide for detection of the SPPs in the detector.

19. An interconnect structure for on-chip information transfer, comprising:
a source configured for electrically generating plasmons;
a detector configured for electrically detecting the generated plasmons; and
a plasmonic waveguide coupled between the source and the detector;
wherein the plasmonic waveguide comprises a first portion configured for propagating surface plasmon polaritons (SPPs) excited in the source and a second portion configured for coupling the SPPs to a long range SPP (LRSPP) mode of the second portion and propagation of LRSPPs.

20. A method for on-chip information transfer, the method comprising the steps of:
providing the interconnect structure of claim 19;
electrically generating plasmons using the interconnect structure;
electrically detecting the generated plasmons using the interconnect structure; and
propagating the plasmons in the plasmonic waveguide coupled between the source and the detector using the interconnect structure.

21. The method of claim 20, comprising generating the plasmons via bias induced tunneling.

22. The method of claim 20, comprising detecting the generated plasmons via a modified tunnel-current under bias induced tunneling.

23. The method of claim 20, comprising propagating surface plasmon polaritons (SPPs) excited in the source in a first portion of plasmonic waveguide.

24. The method of claim 23, comprising coupling the SPPs to a long range SPP (LRSPP) mode of a second portion of the plasmonic waveguide and propagating the LRSPPs.

25. The method of claim 24, comprising providing a gap in the second portion of the plasmonic waveguide for electrical isolation of the source and detector while preserving the propagation of the LRSPPs, preferably comprising coupling the LRSPPs to an SPP mode of a third portion of the plasmonic waveguide for detection of the SPPs in the detector.

26. An interconnect structure for on-chip information transfer, comprising:
a source configured for electrically generating plasmons;
a detector configured for electrically detecting the generated plasmons; and
a plasmonic waveguide coupled between the source and the detector;
wherein the plasmonic waveguide comprises an insulator-metal-insulator (IMI) plasmonic waveguide.

27. A method for on-chip information transfer, the method comprising the steps of:
providing the interconnect structure of claim 26;
electrically generating plasmons using the interconnect structure;
electrically detecting the generated plasmons using the interconnect structure; and
propagating the plasmons in the plasmonic waveguide coupled between the source and the detector using the interconnect structure.

28. The method of claim 27, comprising generating the plasmons via bias induced tunneling.

29. The method of claim 27, comprising detecting the generated plasmons via a modified tunnel-current under bias induced tunneling.

30. The method of claim 27, comprising propagating surface plasmon polaritons (SPPs) excited in the source in a first portion of plasmonic waveguide.

31. The method of claim 30, comprising coupling the SPPs to a long range SPP (LRSPP) mode of a second portion of the plasmonic waveguide and propagating the LRSPPs.

32. The method of claim 31, comprising providing a gap in the second portion of the plasmonic waveguide for electrical isolation of the source and detector while preserving the propagation of the LRSPPs, preferably comprising coupling the LRSPPs to an SPP mode of a third portion of the plasmonic waveguide for detection of the SPPs in the detector.

33. An interconnect structure for on-chip information transfer, comprising:
a source configured for electrically generating plasmons;
a detector configured for electrically detecting the generated plasmons; and
a plasmonic waveguide coupled between the source and the detector;
wherein the plasmonic waveguide has a length of up to about 1 mm, preferably in the range from about 100 µm to 1 mm.

34. A method for on-chip information transfer, the method comprising the steps of:
providing the interconnect structure of claim 33;
electrically generating plasmons using the interconnect structure;
electrically detecting the generated plasmons using the interconnect structure; and
propagating the plasmons in the plasmonic waveguide coupled between the source and the detector using the interconnect structure.

35. The method of claim 34, comprising generating the plasmons via bias induced tunneling.

36. The method of claim 34, comprising detecting the generated plasmons via a modified tunnel-current under bias induced tunneling.

37. The method of claim 34, comprising propagating surface plasmon polaritons (SPPs) excited in the source in a first portion of plasmonic waveguide.

38. The method of claim 37, comprising coupling the SPPs to a long range SPP (LRSPP) mode of a second portion of the plasmonic waveguide and propagating the LRSPPs.

39. The method of claim 38, comprising providing a gap in the second portion of the plasmonic waveguide for electrical isolation of the source and detector while preserving the propagation of the LRSPPs, preferably comprising coupling the LRSPPs to an SPP mode of a third portion of the plasmonic waveguide for detection of the SPPs in the detector.

* * * * *